US011870614B2

(12) United States Patent
Monga

(10) Patent No.: US 11,870,614 B2
(45) Date of Patent: Jan. 9, 2024

(54) METHOD AND SYSTEM FOR HIGH SPEED DECISION-FEEDBACK EQUALIZATION (DFE)

(71) Applicant: Samsung Electronics Co., Ltd., Suwon-si (KR)

(72) Inventor: Sushrant Monga, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 134 days.

(21) Appl. No.: 17/651,619

(22) Filed: Feb. 18, 2022

(65) Prior Publication Data

US 2022/0271978 A1 Aug. 25, 2022

(30) Foreign Application Priority Data

Feb. 20, 2021 (IN) .............................. 202141007170

(51) Int. Cl.
*H04L 25/03* (2006.01)
*H03K 3/037* (2006.01)
*H03F 3/45* (2006.01)

(52) U.S. Cl.
CPC ... *H04L 25/03057* (2013.01); *H03F 3/45475* (2013.01); *H03K 3/037* (2013.01)

(58) Field of Classification Search
CPC .......... H04L 25/03057; H03F 3/45475; H03K 3/037
See application file for complete search history.

(56) References Cited

U.S. PATENT DOCUMENTS 8,731,041 B2 5/2014 Pelteshki et al.
9,130,792 B2 9/2015 Sperlich et al.
9,680,668 B2 6/2017 Laufer et al.
(Continued)

OTHER PUBLICATIONS

Ozkaya, Ilter, et al., "A 64-GB/s 1.4-pJ/b NRZ Optical Receiver Data-Path in 14-nm CMOS FinFET", IEEE Journal of Solid-State Circuits, 52(12), 2017, 3458-3473.
(Continued)

*Primary Examiner* — Janice N Tieu
(74) *Attorney, Agent, or Firm* — Myers Bigel, P.A.

(57) ABSTRACT

An electronic-system for implementing decision-feedback equalization (DFE) includes a first stage including a first-amplifier. The first amplifier including an in-built adder circuit. The first amplifier being configured to charge one or more output nodes of the first amplifier to a first voltage using a summed signal based on input data and a feedback signal in response to a first-clock variation, wherein the feedback signal is a partially-regenerated analog output from a regenerating amplifier. A second stage is includes a second amplifier configured as the regenerating amplifier and connected to the one or more output nodes of the first amplifier, the second amplifier configured to amplify charged output nodes of the second stage to a second voltage in response to a second-clock variation and apply a regenerative gain to the amplified second-voltage during the second-clock variation to generate the partially-regenerated analog output. A third stage includes a slave latch that is configured to resolve the partially-regenerated analog output at the output nodes of the second stage into non-return to zero (NRZ) digital values at an output of the third stage.

20 Claims, 14 Drawing Sheets

(56) References Cited

U.S. PATENT DOCUMENTS

2010/0054324 A1* 3/2010 Bulzacchelli ..... H04L 25/03057
375/233
2021/0288846 A1* 9/2021 Yi ........................... H03F 3/193
2022/0400035 A1* 12/2022 Ko .................... H04L 25/03146

OTHER PUBLICATIONS

Shibasaki, Takayuki, et al., "A 56-GB/s receiver front-end with a CTLE and 1-tap DFE in 20-nm CMOS", 2014 Symposium on VLSI Circuits Digest of Technical Papers, 2014, 1-2.

Turker, Didem Z., et al., "A 19Gb/s 38mW 1-tap speculative DFE receiver in 90nm CMOS", 2009 Symposium on VLSI Circuits, 2009, 216-217.

* cited by examiner

METHOD AND SYSTEM FOR HIGH SPEED DECISION-FEEDBACK EQUALIZATION (DFE)

CROSS-REFERENCE TO RELATED APPLICATION

This application claims the benefit of Indian Patent Application No. 202141007170 filed on Feb. 20, 2021 in the Indian Patent Office, the disclosure of which is incorporated herein by reference in its entirety.

FIELD

The present invention relates to communication receivers and, in particular, to decision feedback equalization systems.

BACKGROUND

With advances in technology, the requirements of systems to send and receive data with reduced latency and power consumption are constantly and gradually increasing. With faster data-communication, however, comes the drawback of distortion. An example of such distortion is inter-symbol interference (ISI) caused at the receiver end.

Typically, terabits-per-second of aggregate bandwidth per integrated circuit is emerging for inter-chip communication in large digital systems. The data is often communicated over widely parallel and bandlimited-channels. Primary challenges for the I/O subsystem is power dissipation and the inter-symbol interference (ISI) due to the limited bandwidth. Several channel equalization techniques have been introduced to compensate for the ISI. Analog or mixed-mode techniques are common for the multi-Gb/s data rates by not requiring very high-speed data converters and by having low complexity. Digitally-tunable discrete-time equalizers have been attractive due to the precise equalization and tunability. In particular, decision-feedback equalizers (DFE) have become popular because of the lower noise and the digital delay chain.

Decision-feedback equalization (DFE) as a mechanism is used in the development of communication receivers in the wireless as well as wireline channels to cancel or reduce distortion. The DFE is a mixed-signal scheme to cancel or reduce the ISI (inter-symbol interference) in the data and to equalize data that suffer variable frequency response of the channel. The DFE mechanism may be applicable for almost all the wireline standards where equalization is required, and all the wireless communications where equalization at very high speeds is a concern.

Referring to FIG. 1, a conventional multi-tap full-rate DFE is illustrated. A binary output of a decision-making slicer (or latch) 102 is captured in an N-stage delay-line delay with N+1 taps. The binary output is fed back with a discrete-time FIR filter of order N and added to the received input signal by means of a summing amplifier (or summer) for reduction or cancellation of ISI. Accordingly, the bits may be detected by the slicer 102 with a low bit error rate (BER). The adjustment of the filter tap-weights may be performed automatically by an appropriate adaptive algorithm. The FIR filter O/P is an analog value whose magnitude is determined by a variable weight vector that can be adapted to set the desired threshold for each bit interval for the mitigation of ISI.

In general, the larger the number of tap weights that can be applied toward cancelling ISI, the more effective the equalization becomes. Unfortunately, the large number of latches and feedback circuits used in a multi-tap DFE consumes significant power and chip area. In some applications, such as a high-end processor chip having thousands of I/O s, the power and area costs of a conventional multi-tap DFE may be prohibitive as the I/O circuitry may consume most of the system power and area budgets. Further, clock generation and distribution at a frequency equal to the data-rate may be costly in terms of power consumption and design effort. In such full rate designs as depicted in FIG. 1, the front-end circuitry needs to run at the data rate.

Direct de-multiplexing at the front-end has been used to relax the design requirements of the clocking and the slicers. Such an approach may also help to save power in the digital de-multiplexing stages; in most systems, the data stream needs to be de-multiplexed to lower rates for the next stage data processing and digital blocks regardless of whether initial data recovery is done at the full data rate. As shown in FIG. 2, in a de-multiplexing front-end, multiple clock phases (depicted as half rate and quarter rate in FIG. 2) run at a fraction of the data rate with phase spacing equal to the bit-time are used to sample the data. Each clock phase as shown in FIG. 2 drives one of the parallel branches, each of which consists of the slicer and following latches.

In contrast to the full rate-architectures, half-rate DFE architectures are found to be high power efficient at data rates which approach the technology limit, such as 10 gigabits per second in present-day CMOS technology. Referring to an example half rate DFE depicted in FIG. 3a, a summer or adder is configured to sum an input with a first feedback tap fed back from a different path. A latch is coupled to the adder to receive a summation signal as input. The latch includes a transparent state, and an output of the latch is used as the first tap in a feedback path to an adder of a same or different path, wherein a fully resolved first tap in the feedback path is used during the transparent state to provide a hard decision of the latch as a part of supplying correction-information. More specifically, the latch is configured to connect with the summer node for further receiving an output from the summer node to curb the loop latency created due to the iterative process of canceling or reducing ISI based on using the previous bits.

Referring to FIG. 3b, another example half-rate decision feedback equalizer (DFE) 300 is illustrated. The DFE 300 is a 1/n rate DFE, where "n" is a positive integer and may be equal to 2. The 1/n rate DFE comprises a plurality of branches 302 for receiving de-multiplexed input data. Examples of the input data may include, but are not limited to, even data bits $D_E$, odd data bits $D_o$, and the like. The 1/n DFE includes a pair of latches 306 to sample the data input. The pair of latches may be driven by a 1/n rate clock on the opposite-phases of the clock. A top slicer 306-1 of the pair of slicers 306 produces the even data bits DE and a bottom slicer 306-2 produces odd bits $D_o$.

The 1/n rate DFE 300 further includes a pair of summer circuits 312 configured in front of the pair of latches 306. A first summer circuit 312-1 adds a feedback signal fed back from a second branch 302-2 of the plurality of branches 302 and a second summer circuit 312-2 adds a feedback signal fed back from a first branch 302-1 to the received data input. Further, to cancel out or reduce the inter symbol interference (ISI), output generated from the latches 306 is passed through a 2:1 multiplexer 310 with a selector driven clock to interleave the even and odd data bits (DE and DO) to form full-rate data (DFR). The multiplexer 310 is configured to multiplex the different partial bit sequences of each branch to assemble a full rate bit sequence.

The full rate bit sequence is further driven through an IIR filter 304. The IIR filter 304 filters the received full rate bit sequence and transmits the full rate bit sequence to the summer circuits 312. Inter-symbol interference (ISI) is reduced or canceled from the full rate bit sequence. A first DFE feedback tap (H1) is a conventional discrete type and can be independently adjusted to match the first post-cursor of the channel impulse response.

An implementation based on interleaving by 4 as compared to FIG. 3b is illustrated in FIG. 3c. FIG. 3c illustrates a 1:4 de-multiplexing scheme or a Quarter-Rate DFE, where four equally-spaced phases of a quarter-rate clock are used to sample the data, thereby allowing the clock buffers and the four parallel front-end slicers to operate at a frequency of only one quarter that of the data rate. The sampling clock phases are Ck1 to Ck4 or Clock-phases I, Q, $I_b$ or $Q_b$.

Despite its prevalence, both of the DFE implementations of FIGS. 3b and 3c may suffer from the loop-latency issue at very high speeds of incoming data as it is a non-linear scheme involving the feedback from the last-received bit to the current decision stage to reduce or cancel the ISI. Especially at high speeds, it remains difficult to get optimum timing margins for feedback or even close the loop for accurate reduction or cancellation of the ISI. While speculative DFE schemes are considered for implementation, they derive substantially close timing margins for the loop delay as the speed increases while leading to an exponential increase in power and area due to replication of the parallel paths. As the number of feedback taps grows, the power and area further grow exponentially while being unable to fetch the desired timing-margins for the feedback.

Specifically, a tight timing constraint exists in the implementation of the mixed-signal DFE. For the first tap of the equalizer, the decision from the data slicer is fed back to the adder and may settle within one bit-time with respect to a full rate DFE. As the operating frequency (Hz) increases, the power requirement (W) increases rapidly to speed up the regeneration-time when self-loading is comparable to the load capacitance. As shown in FIG. 3c, regardless of the number of interleaving of the data bits, the output of each slicer still has to provide the decision and feedback to the next slicer within 1 bit-time. Not only is the critical path not relaxed, but interleaving DFEs also results in increased power dissipation because the number of high-speed elements is multiplied.

Additionally, the delay of the summer needs to be much smaller than the overall timing budget of the feedback loop. At very high data-rates, the design of a linear and precise summer that meets this timing requirement may be a very challenging task. A settling requirement of the summer implies that the RC time constant of the output node should be much smaller. This requirement often dictates high power consumption in the summing-amplifier.

As depicted in FIG. 4, a signal summation is accomplished in the current domain by connecting together ("dotting") drain currents (ID1, ID2, ID3 . . . ) of multiple differential pairs of transistors. The differential pairs which receive the data input ($D_{IN}$) and the previous decisions or sampled digital values ($D_{-1}$, $D_{-2}$, $D_{-3}$ . . . $D_{-N}$) each corresponding to a parallel path of a half rate or a quarter rate DFE are resistively degenerated with resistors via linear conversion of voltage to current. The summed currents are converted into voltages. To achieve reliable operation, the feedback signals of the DFE need to be accurately established at the slicer input before the next data decision is made. The critical path delay is less than 1 UI. The RC time constant at the output of the summing amplifier can add significant delay to this critical path by degrading the settling time of the feedback signals.

To reduce the RC time constant so that the critical timing requirements can be met, the load resistance must often be reduced to a low value. To meet amplifier gain and voltage swing requirements, the reduction must be accompanied by a commensurate increase in operating currents, leading to higher power dissipation. In summary, as the analog-summation node can have a large capacitance, a large analog current is often needed to reduce the summation RC time constants.

Overall, for given process technology, the total power of the DFE may increase dramatically with higher data rates.

SUMMARY

This summary is provided to introduce a selection of concepts in a simplified format that are further described in the detailed description of the invention. This summary is not intended to identify key or essential inventive concepts of the claimed subject matter, nor is it intended for determining the scope of the claimed subject matter.

Some embodiments of the inventive concept provide an electronic-system for implementing decision-feedback equalization (DFE). The system comprises a first stage comprising a first-amplifier, the first amplifier comprising an in-built adder circuit, the first amplifier being configured to charge one or more output nodes of the first amplifier to a first voltage using a summed signal based on input data and a feedback signal in response to a first-clock variation, wherein the feedback signal is a partially-regenerated analog output from a regenerating amplifier. A second stage comprising a second amplifier configured as the regenerating amplifier and connected to the one or more output nodes of the first amplifier, the second amplifier configured to amplify charged output nodes of the second stage to a second voltage in response to a second-clock variation and apply a regenerative gain to the amplified second-voltage during the second-clock variation to generate the partially-regenerated analog output. A third stage comprising a slave latch that is configured to resolve the partially-regenerated analog output at the output nodes of the second stage into non-return to zero (NRZ) digital values at an output of the third stage.

Some embodiments of the inventive concept provide a flip-flop for implementing decision-feedback equalization (DFE), the flip-flop comprising a master latch comprising a first amplifier comprising an in-built adder circuit, the first amplifier configured to charge one or more output nodes of the first amplifier to a first voltage using a summed signal based on input data and a feedback signal in response to a first-clock variation, wherein the feedback signal is a partially-regenerated analog output from a regenerating amplifier; and a second amplifier that is configured to generate the partially-regenerated analog output; and a slave latch configured to resolve the partially-regenerated analog output into non-return to zero (NRZ) digital values at an output of the third stage.

Some embodiments of the inventive concept provide a method for implementing decision-feedback equalization (DFE) in an electronic circuit. The method comprises charging one or more output nodes of a first amplifier to a first voltage using a summed signal based on input data and a feedback signal in response to a first-clock variation, wherein the feedback signal is a partially-regenerated analog output from a regenerating amplifier. Further, the method comprises amplifying charged output nodes of the first amplifier to a second voltage in response to a second-clock variation and applying a regenerative gain to the amplified second-voltage during said second-clock variation. Further, the method comprises resolving, by a latch, the amplified second-voltage provided with the regenerative gain into non-return to zero (NRZ) digital values.

To further clarify the advantages and features of the present invention, a more particular description of the invention will be rendered by reference to specific embodiments thereof, which is illustrated in the appended drawings. It is appreciated that these drawings depict only typical embodiments of the invention and are therefore not to be considered limiting of its scope. Embodiments of the invention will be described and explained with additional specificity and detail with the accompanying drawings.

BRIEF DESCRIPTION OF FIGURES

These and other features, aspects, and advantages of the present invention will become better understood when the following detailed description is read with reference to the accompanying drawings in which like characters represent like parts throughout the drawings, wherein.

Figure 1:
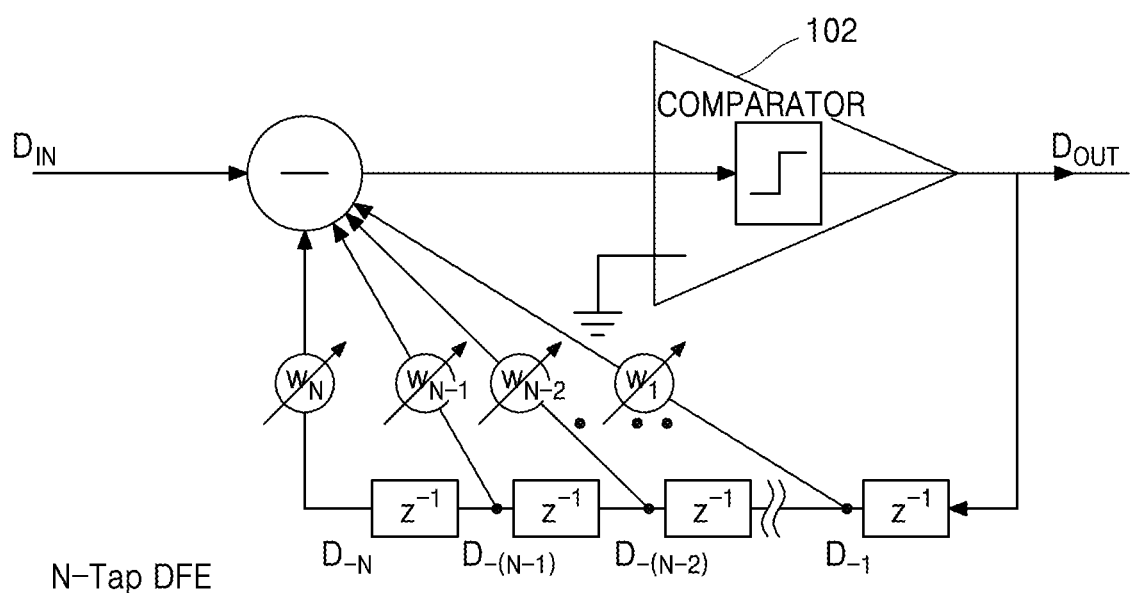
FIGS. 1-4 illustrates conventional decision feedback equalization systems.

Further, skilled artisans will appreciate that elements in the drawings are illustrated for simplicity and may not have been necessarily drawn to scale. For example, the flow charts illustrate the method in terms of the most prominent operations involved to help to improve understanding of aspects of the present inventive concept. Furthermore, in terms of the construction of the device, one or more components of the device may have been represented in the drawings by conventional symbols, and the drawings may show only those specific details that are pertinent to understanding the embodiments of the present inventive concept so as not to obscure the drawings with details that will be readily apparent to those of ordinary skill in the art having benefit of the description herein.

DETAILED DESCRIPTION

For the purpose of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated system, and such further applications of the principles of the invention as illustrated therein being contemplated as would normally occur to one skilled in the art to which the invention relates.

It will be understood by those skilled in the art that the foregoing general description and the following detailed description are explanatory of the invention and are not intended to be restrictive thereof.

Reference throughout this specification to "an aspect", "another aspect" or similar language means that a particular feature, structure, or characteristic described in connection with the embodiment is included in at least one embodiment of the present invention. Thus, appearances of the phrase "in an embodiment", "in another embodiment" and similar language throughout this specification may, but do not necessarily, all refer to the same embodiment.

The terms "comprises", "comprising", or any other variations thereof, are intended to cover a non-exclusive inclusion, such that a process or method that comprises a list of steps does not include only those steps but may include other steps not expressly listed or inherent to such process or method. Similarly, one or more devices or sub-systems or elements or structures or components proceeded by "comprises . . . a" does not, without more constraints, preclude the existence of other devices or other sub-systems or other elements or other structures or other components or additional devices or additional sub-systems or additional elements or additional structures or additional components.

Unless otherwise defined, all technical and scientific terms used herein have the same meaning as commonly understood by one of ordinary skill in the art to which this invention belongs. The system, methods, and examples provided herein are illustrative only and not intended to be limiting.

The same reference numerals are used for the same elements in the drawings, and redundant descriptions thereof will be omitted. As used herein, the term "and/or" includes any and all combinations of one or more of the associated listed items. It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present.

Embodiments of the present invention will be described below in detail with reference to the accompanying drawings. It is noted that aspects described with respect to one embodiment may be incorporated in different embodiments although not specifically described relative thereto. That is, all embodiments and/or features of any embodiments can be combined in any way and/or combination.

Figure 5:
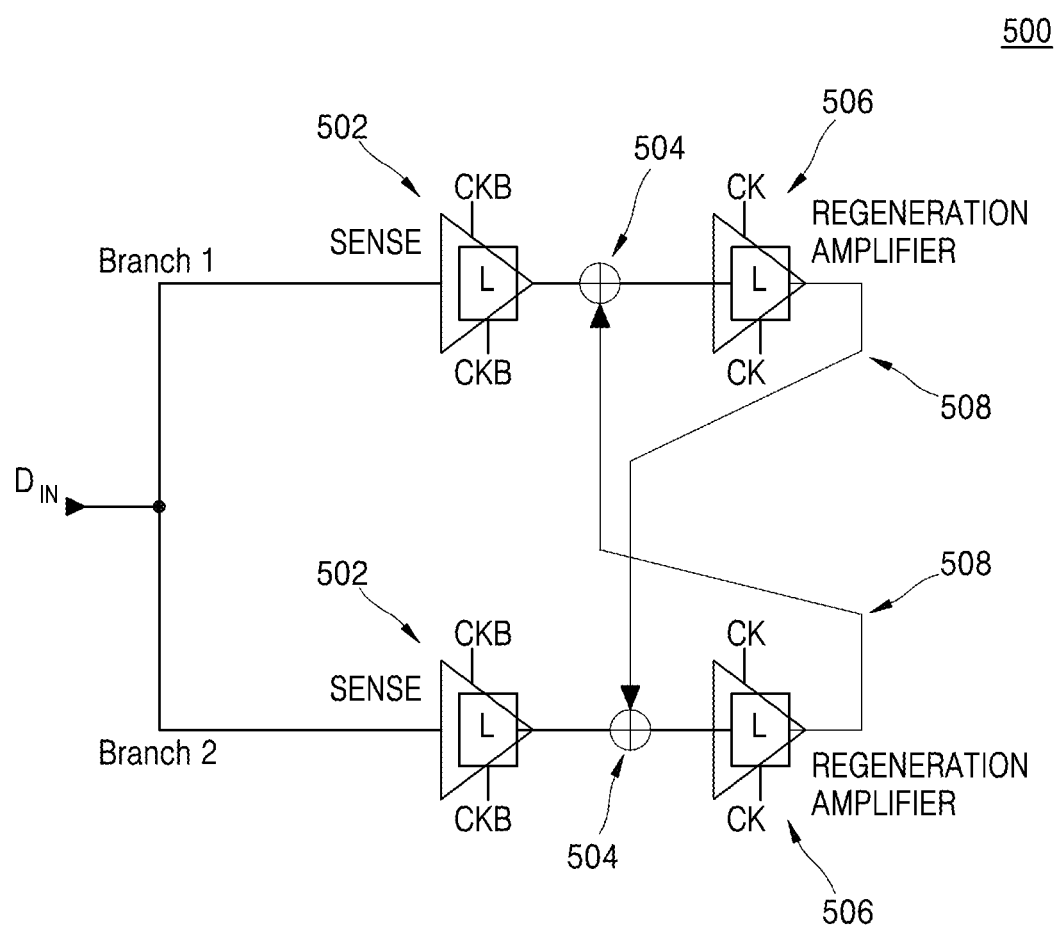
FIG. 5 illustrates a half-rate based implementation of decision feedback equalization, in accordance with embodiments of the inventive concept.

Now referring to FIG. 5, an electronic-system 500 for implementing decision-feedback equalization (DFE) is depicted through a half-rate implementation in accordance with an embodiment of the present inventive concept. The half-rate DFE within the system 500 naturally demultiplexes input data $D_{IN}$ into two parallel data streams Branch 1 (e.g. even data bits, $D_E$), and Branch 2 (e.g. odd data bits, $D_o$). The Branch 1 and Branch 2 are driven by clock-phases CK and CKB, respectively.

Each of the branches (i.e. Branch 1, Branch 2) comprises a first stage defined by a first-amplifier 502, which may be a pre-charging sense amplifier (i.e. dynamic latch), configured for charging one or more output nodes to a first-voltage in response to a first-clock variation. During the first clock variation, data with respect to the received input-signal and the received feedback-signal is summed to generate a summed signal. The received feedback signal corresponds to an analog output from the other branch, i.e. feedback to Branch 1 arrives from the Branch 2. In addition, the amplifier 502 comprises an in-built adder circuit 504 as a current-based addition stage for such purposes.

Figure 8:
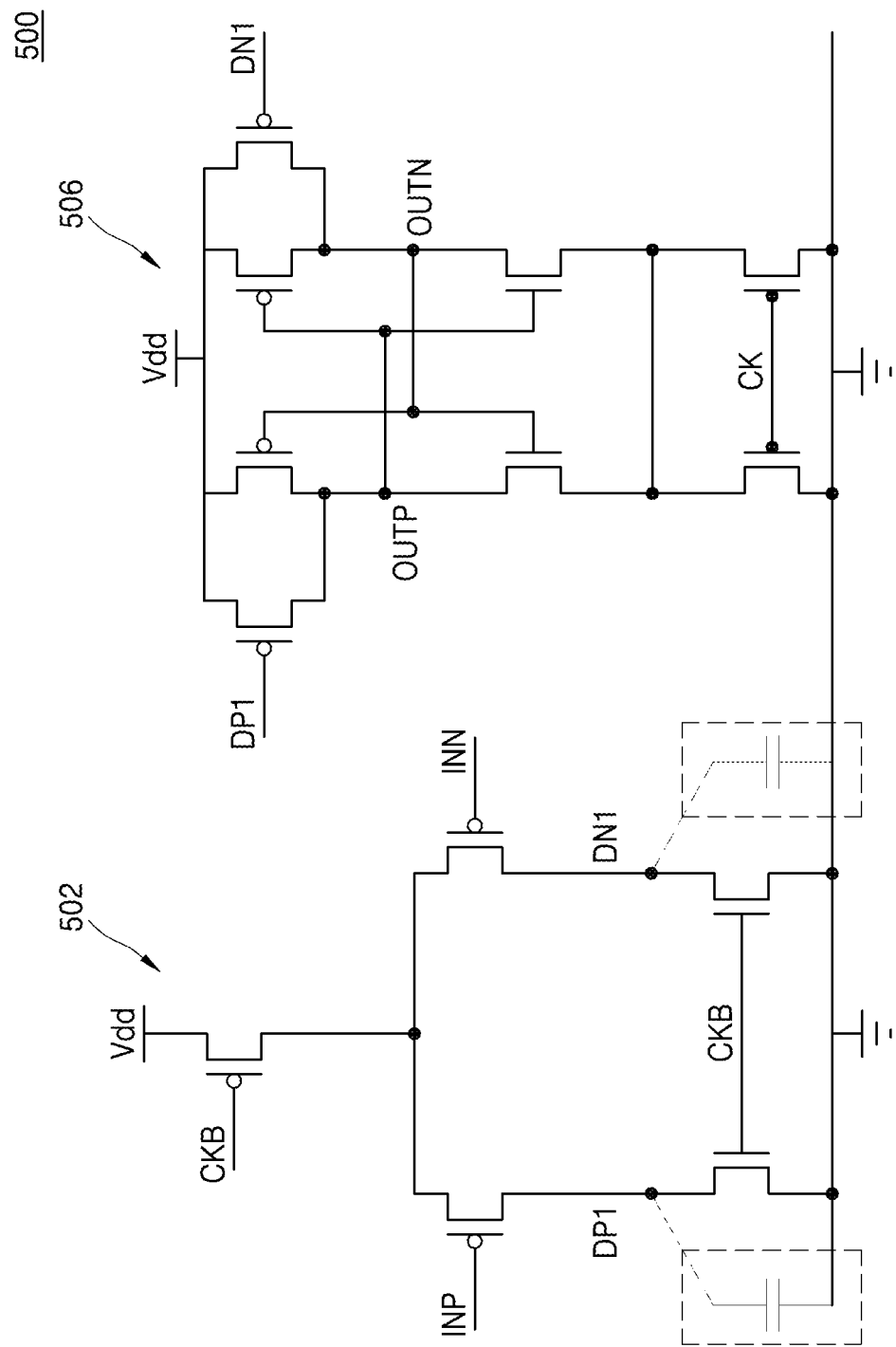
FIG. 8 illustrates another circuit-diagram representation with respect to FIG. 5 and FIG. 6, in accordance with another embodiment of the inventive concept.
Figure 9:
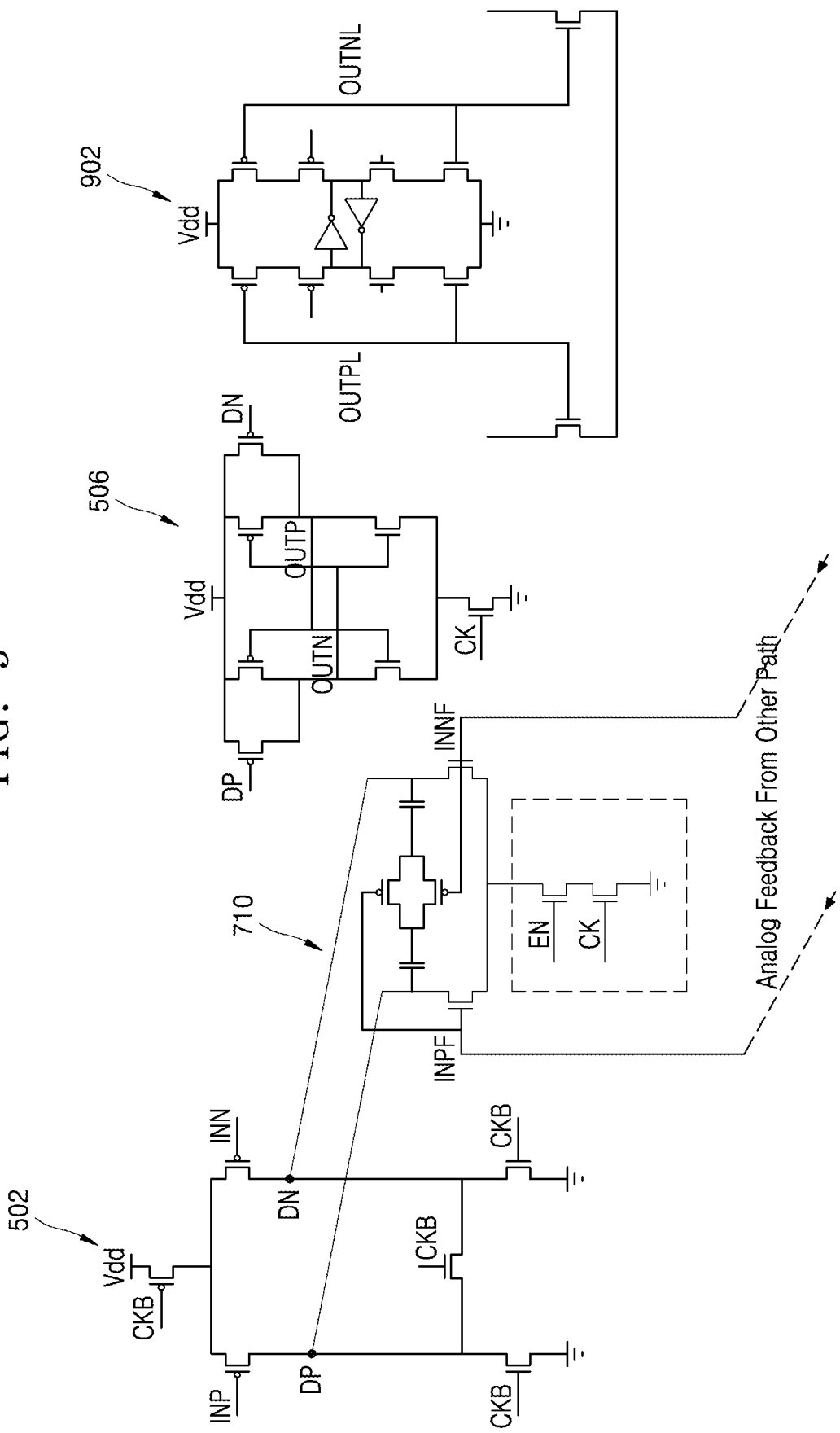
FIG. 9 illustrates another circuit-diagram representation with respect to FIG. 5 and FIG. 6, in accordance with another embodiment of the inventive concept.

The summed signal is a summed differential current obtained by summing drain currents of a differential-transistor configuration (as shown in FIG. 8 and FIG. 9) corresponding to the input signal from one branch and the feedback signal from the other branch. In another example, the summed signal is a summed differential-voltage obtained by summing differential voltages of the differential-transistor configurations.

The summed-signal triggers a capacitor-charge/discharge at the output-nodes to cause the development of the first voltage at the first amplifier 502. The first voltage is a positive differential voltage obtained based on a sign of a differential current defining the summed-signal. The addition of the input signal to the feedback signal at the first amplifier 502 enables generation of an equalized signal.

As a part of the second stage, the charged output nodes of the first amplifier 502 are resolved to a second-voltage during a second-clock variation as a part of resolution phase upon a second clock variation. A second-amplifier 506 may be a regenerating-amplifier (i.e. dynamic latch) which is connected in series with said output nodes of the first amplifier 502 and configured to apply a regenerative-gain to the second voltage in response to the second-clock variation. The first amplifier 502 and second-amplifier 506 each comprises a differential-amplifier or a single ended amplifier operating based on amplification of the differential inputs. The first and second amplifiers 502, 506 operate based on clock signals (e.g. complementary clock signals) during the same time-period corresponding to each of the clock-signals.

Further, a feedback-path 508 is provided from the output of the second amplifier 506 for extracting an analog or partially-regenerated output from the second amplifier 506 for communicating an analog-value to the first amplifier 502 for addition to the received input signal to produce the summed signal during the first stage. More specifically, partially resolved analog-values are used in the feedback path 508 during the transparent state of the second amplifier 506 to provide a soft decision to supply feedback during the first stage before the second amplifier 506 entirely regenerates to a rail voltage, i.e. much in advance of a hard decision of the second amplifier 506. In an example, the adder 504 may be a current summer, such as a gm-block controlled by the differential voltage from the second amplifier 506. The feedback path 508 may in some embodiments comprise a third-differential amplifier for amplifying the partially-regenerated output and thereby communicate the analog-value as the feedback signal. The feedback signal may be obtained through a third differential amplifier (as shown in FIG. 7 as 710) in the feedback path 508.

In an example embodiment, a sense amplifier flip-flop (SAFF) is used for implementing the decision-feedback equalization (DFE) based on the system 500. The SAFF further comprises a latch (shown in FIG. 9 as 902), which is implemented in a slave-configuration and connected at the output of the second amplifier 506 to result in a flip-flop operation.

The master-configuration portion comprises the first amplifier 502, the second amplifiers 506, the in-built adder circuit 504 within the first amplifier 502, and the feedback path 508. The slave-configuration defining an SR latch corresponds to a slave latch 902 as depicted in FIG. 9.

A settling of summer 504 within the first amplifier 502 coincides with an overall set-up time of the flip-flop. More specifically, the elimination of RC delay at the output of the summation due to summer 504 forming a part of the system 500 facilitates meeting the timing constraints of the DFE critical path and, thus, may permit the desired data rates to be achieved with lower power consumption.

Figure 6:
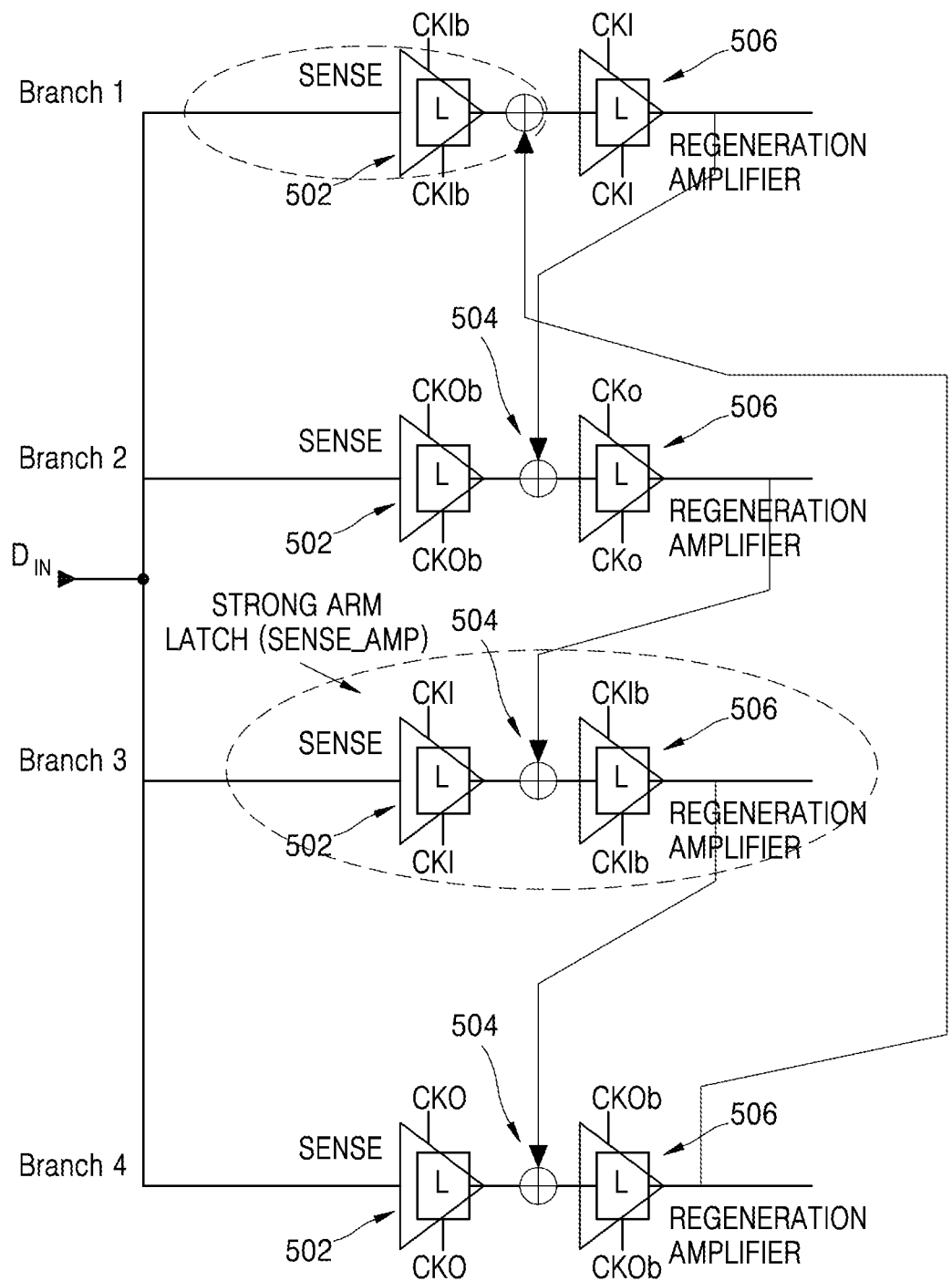
FIG. 6 illustrates a quarter-rate based implementation of decision feedback equalization, in accordance with embodiments of the inventive concept.

Now referring to FIG. 6, an electronic-system 600 for implementing decision-feedback equalization (DFE) is depicted through a quarter-rate implementation 600 in accordance with an embodiment of the present inventive concept. The quarter-rate DFE 600 demultiplexes input data DIN into four parallel data streams ($D_N$, $D_{N+1}$, $D_{N+32}$, $D_{N+43}$) represented by Branches 1 to 4. The Branches 1-4 are driven by clock-phases I, Q, $I_B$, $Q_B$ respectively. Each of the Branches 1 to 4 are composed similarly to the branches 1, 2 depicted in FIG. 5 and function in accordance with the description of FIG. 5.

In an example, the first Branch 1 provides analogue feedback 508 to Branch 2, the second Branch 2 provides analogue feedback 508 to Branch 3, the third Branch 3 provides analogue feedback 508 to Branch 4, and the fourth Branch 4 provides analogue feedback 508 to Branch 1.

Figure 7A:
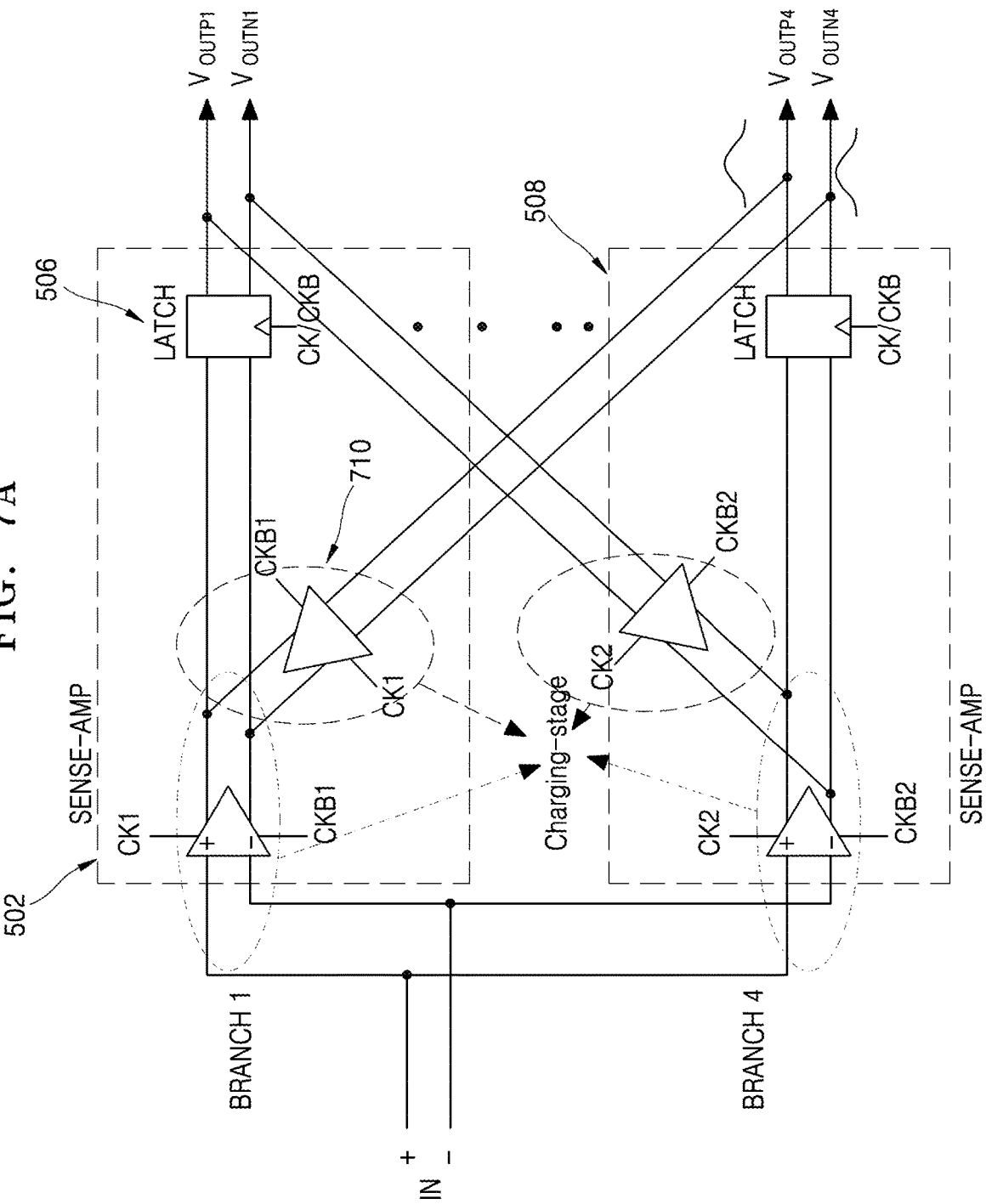
FIGS. 7a and 7b illustrate a circuit-diagram representation with respect to FIG. 5 and FIG. 6, in accordance with another embodiment of the inventive concept.
Figure 7B:
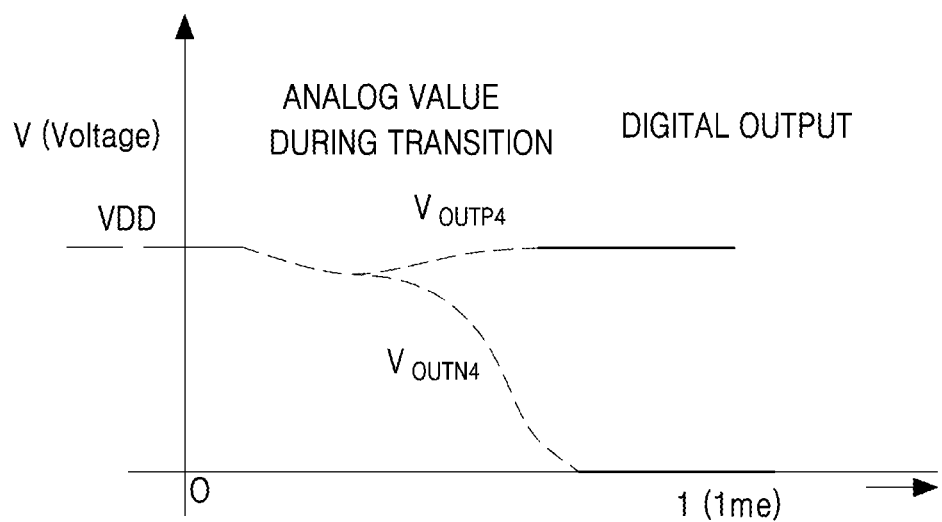

FIGS. 7a and 7b further illustrate an example DFE scheme implementation with respect to FIG. 6 through a differential configuration. FIG. 7a illustrates the example embodiment realization with respect to Branch 1 and Branch 4 amongst the branches 1 to 4 for sake of brevity. More specifically, FIG. 7a illustrates an example-realization of the feedback 508 from Branch 4 to Branch 1 through a differential amplifier 710, which may be driven by the same clock phase as corresponding to Branch 1. FIG. 7b further illustrates an example differential output ($V_{ouTp4}$, $V_{ouTN4}$) from the regenerating amplifier 506 with respect of Branch 4. As may be seen, the output is regenerated in analog and gradually transforms from an initial analog value into fully regenerated value (i.e. digital values, rail to rail voltage) over a period of time (e.g., 1 ms). However, the analog value of the output is communicated as feedback from Branch 4 to Branch 1.

Likewise, the present implementation of example embodiments may be extended to cover analog feedback provided from Branch 1, 2, 3 and communicated to Branches 2, 3 and 4, respectively.

FIG. 8 illustrates a circuit diagram representation of FIG. 5, FIG. 6, and FIG. 7. For sake of brevity, the FIG. 8 has been illustrated with respect of FIG. 5. The first amplifier is precharged to GND (that is for the high state of CKB) and is charged to the respective voltages on the output capacitors during the active state of the clock (this is CKB=0) and the second amplifier 506 is precharged to VDD during the low state of CK (this is a complimentary clock to the clock CKB). In the active state of both the amplifiers (CK=VDD; CKB=0) the O/P nodes DP1, DN1 are charged to the respective voltages that are thereby resolved to respective rail voltages at the O/P of the second amplifier 506 as OUTP, OUTN.

Embodiments of the present inventive concept may provide a power-efficient way of meeting the critical timing requirements of eliminating the RC delay at the output of the summer 504 by integrating the summer with the first amplifier 502 or sense amplifier 502.

In operation, when CK is low (and its complement CKB is high), PMOS transistors pull the output nodes of the sense amplifier to the positive power supply. This is the precharge state of the SAFF. When CK goes high (and CKB goes low), the summer output currents begin to charge the parasitic capacitors on output nodes of the first amplifier 502 to respective voltages Based on the sign of the summed differential currents, either a positive or negative differential voltage begins to develop. The elimination of RC delay between the summation and latching functions facilitates meeting the timing constraints of a DFE critical-path and, thus, may permit the desired data rates to be achieved with lower power consumption. The critical path may be defined as a net loop delay whose delay is required to be less than 1 unit interval or 1 bit-time period.

With respect to the second amplifier 506 or regenerator, while the output is being regenerated to a rail voltage, feedback is beforehand extracted in analog-form for subtracting ISI in the adder. As shown in FIG. 7b, the example differential output (VOUTP4, VOUTN4) from the regenerating amplifier 506 is depicted. As may be seen, the output is regenerated in analog and gradually transforms from an initial analog value into a fully regenerated value (i.e. digital values, rail to rail voltage) over a period of time (e.g., 1 ms). However, the analog value of the output is communicated as feedback. While the fully regenerated value propagates to the adder within the next 1 bit time, partial results in the form of analog values are beforehand communicated to the adder well before full regeneration is made.

Overall, the present operation reduces or minimizes the net loop delay for the DFE by using the partially resolved analog values from the regenerator as feedback and performing the summing operation of the feedback and input data within this resolution stage before the fully regenerated values from the regenerator are output as part of completion of the regeneration.

As used herein, an analog value refers to a partially generated analog-value that is communicated as feedback. The completely regenerated rail to rail voltage corresponds to a digital value recognized as a hard decision. In an example, the time-period of generation of the analog voltage may be smaller than the full regeneration time (i.e. hard decision time or digital value generation time) by almost 0.5 UI. this may reduce or minimize feedback delay, thereby in turn reducing or minimizing the net loop delay of the DFE. The analog-feedback at the precharge stage may save the regeneration-time as compared to the standard DFE scheme, and accordingly may render a fastest loop feedback at the desired nodes.

The net loop delay may be substantially less than 1 bit-time period, thereby allowing the feedback to close with an optimum timing margin and in turn allow the DFE to undergo high-speed operations. Specifically, the decision feedback-loop is closed at the first stage that is a precharge stage of the sense-amplifier with the analog feedback voltage contrary to the digital feedback used in the conventional DFE scheme. Moreover, the summer-node of the DFE is combined with the latch to address the loop latency issue. As a result of the foregoing, the setting-up of the flip-flop and the summing operation occur concurrently due to the synergistic-effect, which may enable closing the loop with optimum and safe timing-margin.

FIG. 9 illustrates a circuit diagram representation of FIG. 7 according to some example embodiments of the inventive concept. Specifically, FIG. 9 illustrates an implementation of an example embodiment of a feedback stage through the differential amplifier 710 to form the addition through a differential configuration for communicating the analog feedback to the first amplifier 502 from the second amplifier 506, which acts as the regenerative buffer, of a different branch.

Further, a slave latch 902 is depicted as a third stage that is placed at the output of the second amplifier or the regenerating amplifier 506 and is configured to keep data valid during phases of a clock cycle. The slave latch 902 is configured to convert a Return-to-Zero (RZ) sequence to a Non-Return to Zero (NRZ) sequence at the output. In other words, the third stage is defined by the slave-latch (902) for resolving the voltage at the output of the second stage into non-return to zero (NRZ) digital values at the output of the third stage. The latch 902 may be a CML, static CMOS type and double regenerating latch.

Figure 10:
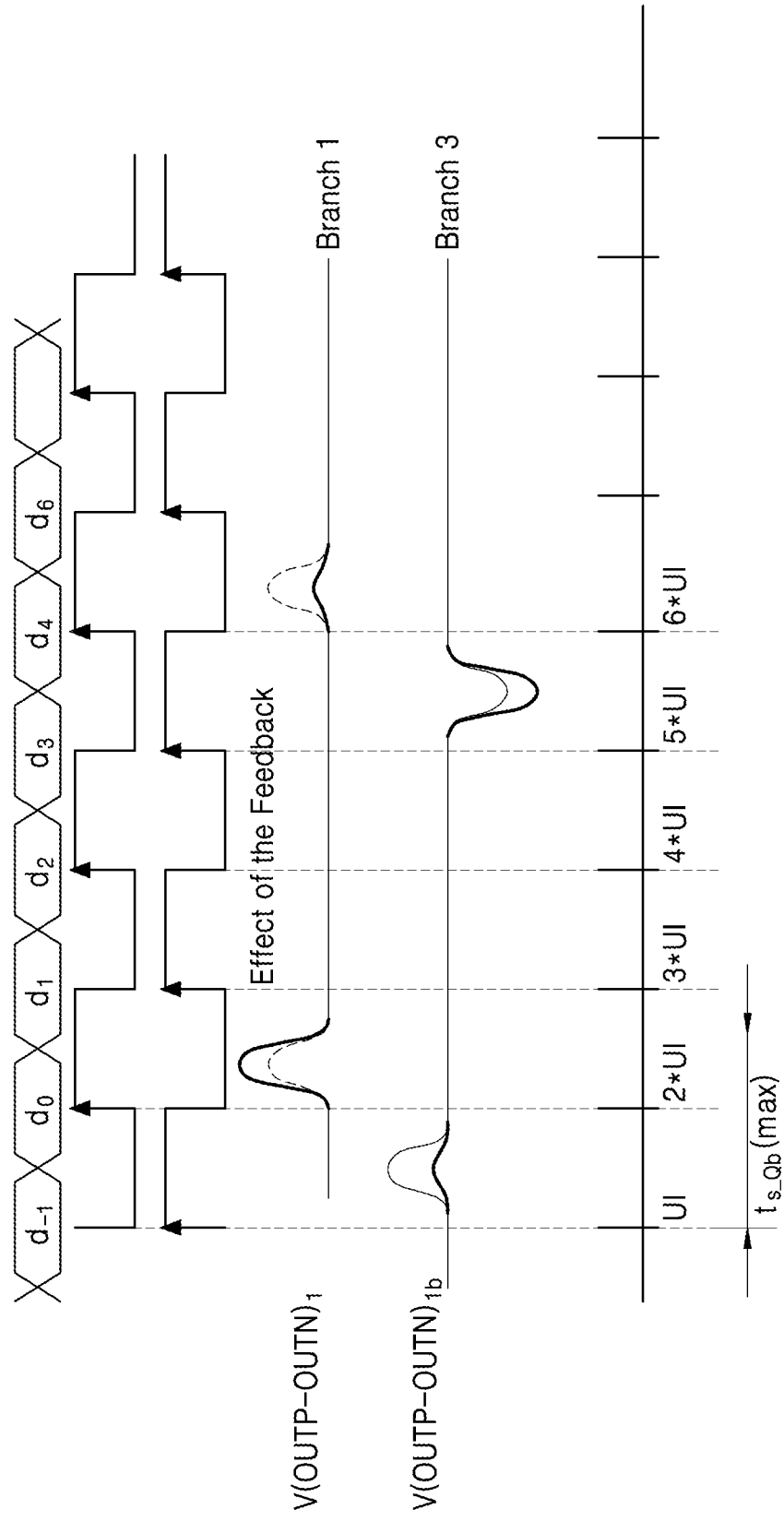
FIG. 10 illustrates waveforms depicting the operation of decision feedback equalization, in accordance with another embodiment of the inventive concept.

FIG. 10 illustrates an output waveform of the second amplifier 506 or regenerator amplifier 506 in accordance with an embodiment of the present inventive concept for the quarter rate DFE configuration as illustrated in FIG. 6 and FIGS. 7a and 7b. More specifically, FIG. 10 illustrates output waveforms from respective second amplifiers 506 of Branch 1 and Branch 3 corresponding to clock phases I and $I_b$. FIG. 10 illustrates the comparison of the two waveforms with feedback from the stage 710 as depicted in FIG. 9, and without feedback. The data is shown for both cases of the previous bit being '0' and '1' respectively.

Figure 11:
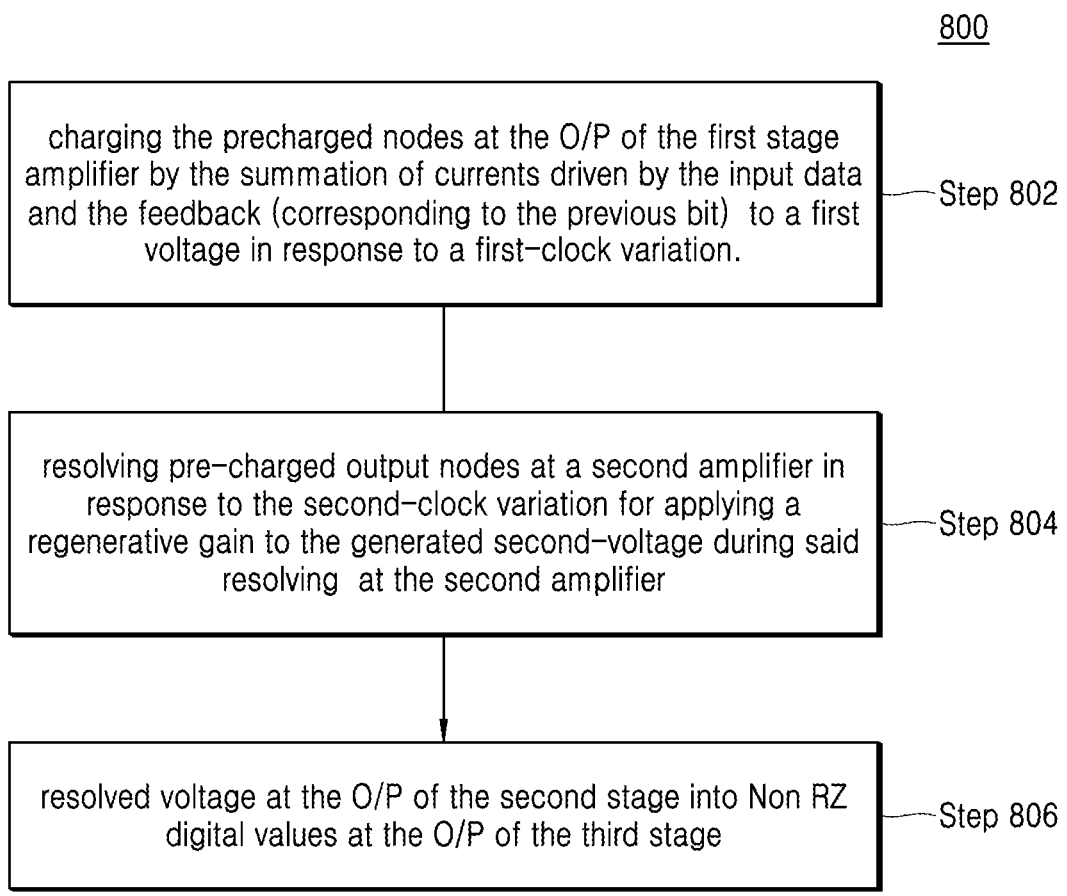
FIG. 11 is a flowchart that illustrates a method of operation of decision feedback equalization in accordance with embodiments of the inventive concept.

FIG. 11 is a flowchart that illustrates method operations of DEF in accordance with embodiments of the present inventive concept.

Block 802 denotes charging the precharged nodes at the output of the first amplifier (502) of the first stage in response to a first-clock variation. This is effected with a resultant sum of currents from the input data from the first stage and the feedback stage (508) (corresponding to the previous bit). More specifically, as a part of present operation at block 802, data with respect to a received input-signal and a feedback-signal (from another branch) is added to generate a summed signal, the addition being executed through an in-built summer (504) at the first amplifier 502. The first amplifier 502 comprises an in-built adder circuit 504 for such purposes. Further, as a part of present operation at block 802, a partially-regenerated output is extracted from the second amplifier for communicating an analog-value as the feedback signal to the first amplifier 502. More specifically, partially resolved analog-values are used in the feedback path 508 during the transparent state of the second amplifier 506 to provide a soft decision to supply feedback before the second amplifier 506 entirely regenerates to a rail voltage, i.e., much in advance of a hard decision of the second amplifier 506.

The first-amplifier 502 may be a pre-charging sense amplifier (i.e. dynamic latch) configured for pre-charging one or more output nodes to the first voltage in response to the first-clock variation.

Block 804 corresponds to a second stage and denotes resolving the pre-charged output nodes to a second voltage during the second-clock variation. Block 804 denotes resolving pre-charged output nodes at a second amplifier 506 in response to the second-clock variation. The second-amplifier 506 may be a regenerating-amplifier (i.e. dynamic latch), which is connected in series with said output nodes of the first amplifier 502 and configured to apply a regenerative-gain to the second voltage in response to the second-clock variation. The first and second amplifiers 502, 506 operate based on complementary clock signals during the same time-period corresponding to each of the clock-signals. Accordingly, as a part of the resolution, a regenerative gain is applied to the generated second-voltage during the resolving at the second amplifier 506.

Block 806 denotes resolving the voltage at the O/P of the second stage into NRZ digital values by a latch 902 at the O/P of the third stage.

Embodiments of the present inventive concept may provide a DFE scheme that is substantially lower in power consumption than conventional DFE techniques. The feedback may be at the very first stage (with respect to the input of the DFE) with analog-signals as the input to the DFE along with the feedback signal. Moreover, the scheme in accordance with the present subject matter is not constrained by the CML type of design and, thus, may not be characterized by high power consumption and/or limited by the static power consumption, speed metric, and/or speed-power metric.

In an example, with respect to an implementation according to some embodiments of the inventive concept, the charging-stage of the sense-amplifier has been shown to work for 25 Gb/s as compared to the state of the art CML stages used in the conventional DFE schemes at very high speeds that may be characterized by large current draws as compared to the charge-stage of the sense amplifier.

In an example, the following Table 1 provides a comparison with respect to conventional techniques:

TABLE 1

| S. No | Power (mW) | Scheme | Speed(Gb/s) |
|---|---|---|---|
| [1] | 38 | Half-rate 1-tap Speculative | 19 |
| [2] | 20 | Present embodiments of the inventive concept | 24 |
| [3] | 55 | 1-tap Speculative sense-amp based | 64 |
| [4] | 170 | 1-tap Speculative sense-amp based | 56 |

In some embodiments, the summer node, e.g., in-built adder circuit, is implemented inside the first amplifier stage and accordingly, feedback is closed at the first stage itself. Accordingly, embodiments of the inventive concept do not segregate into the latch, e.g., flip-flop and/or the summer node operations for digitizing the output feedback nor do they require a separate mechanism to incorporate the digital/analog value of the tap-coefficient. The operation of the first amplifier stage may be definitively linear with the feedback and the input summation at the same node.

Figure 2:
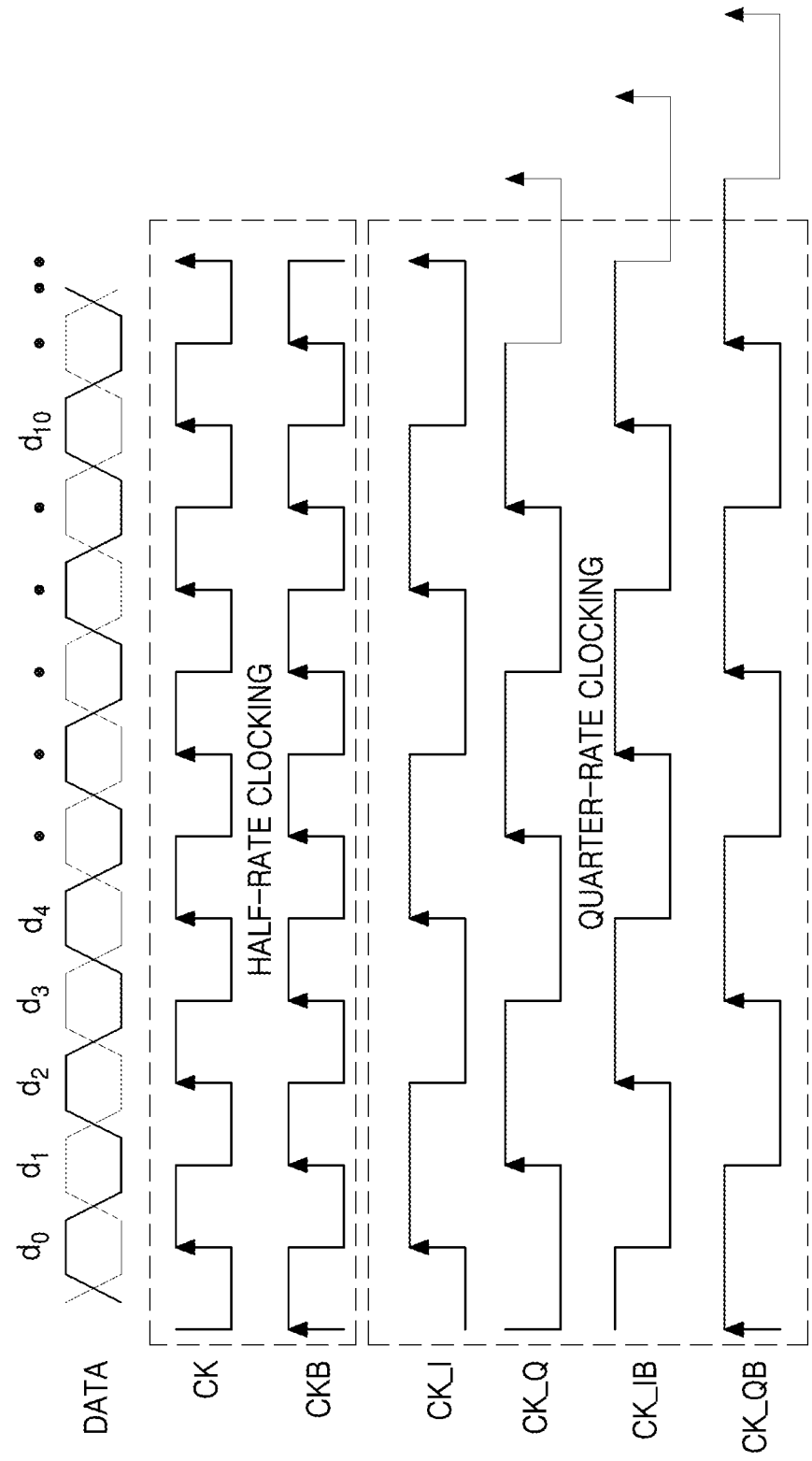
Figure 3A:
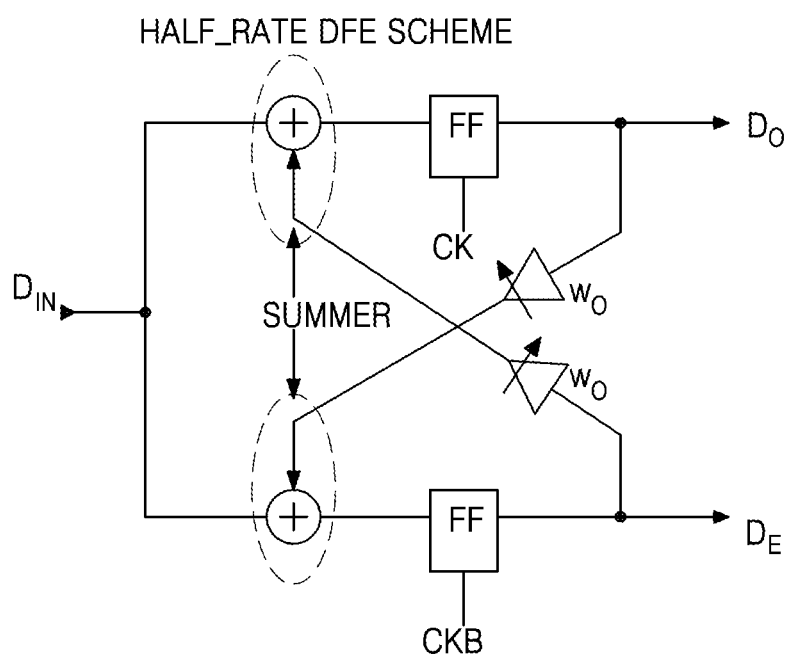
Figure 3B:
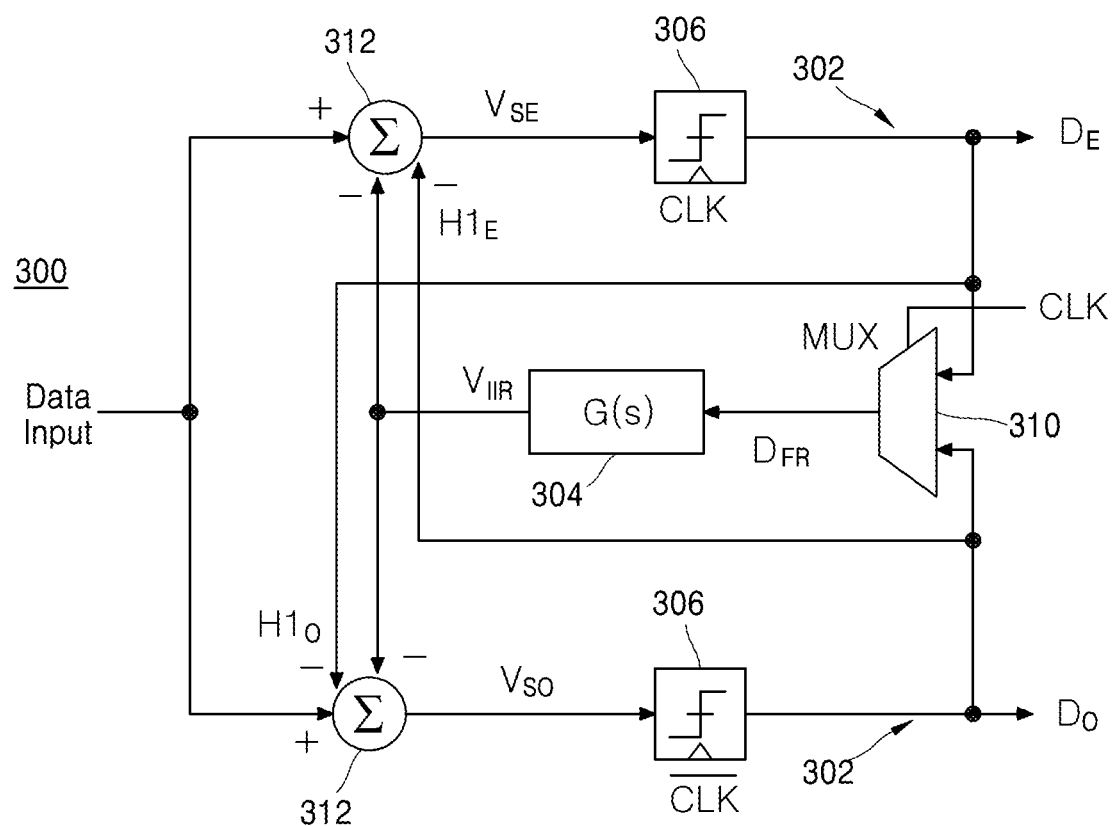
Figure 3C:
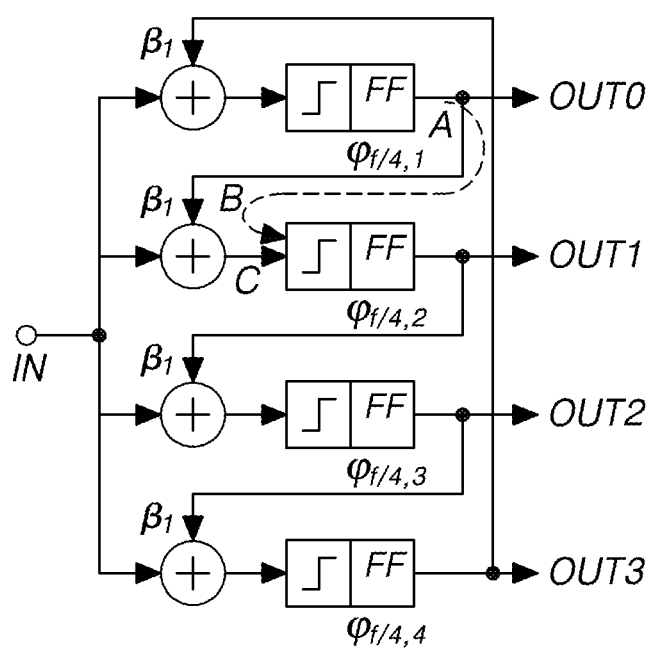
Figure 3C:
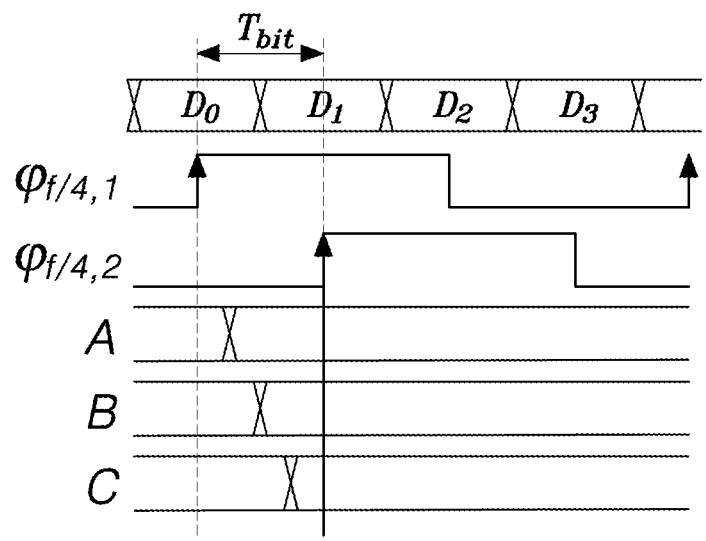
Figure 4:
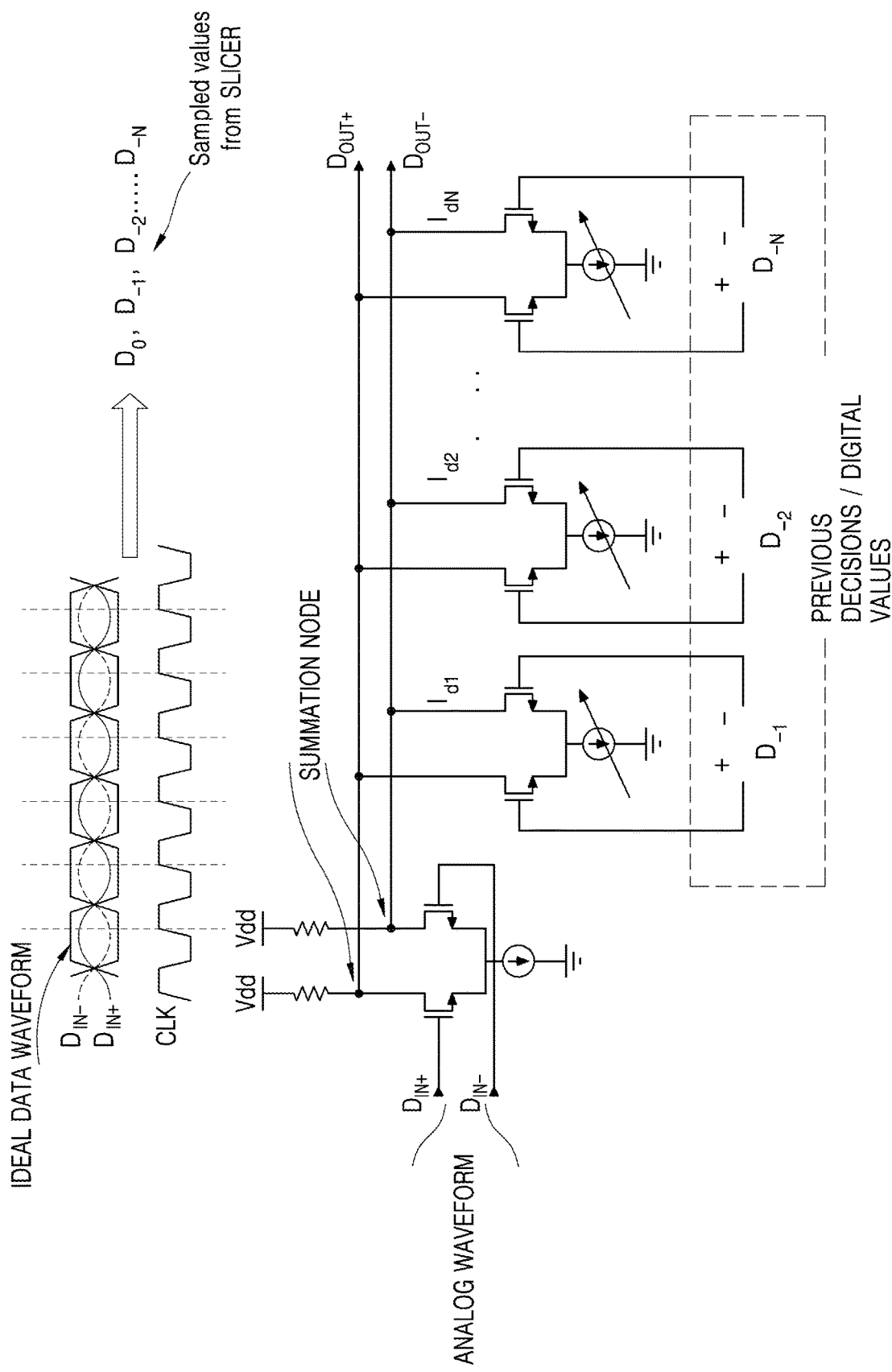

Unlike the conventional half-rate DFE (e.g. DFEs depicted in FIG. 2 and FIG. 3) that is constrained by the regeneration time of the flip-flops and the settling time of the summer circuit, e.g., in-built adder circuit, embodiments of the inventive concept are not constrained to be hard-limited by the rails that save the regeneration-time. Moreover, the settling of the summer circuit coincides with the set up time of the latch, e.g. flip-flop, thereby substantially minimizing the net loop delay.

Further, the DFE in accordance with the present inventive concept is not constrained by the aforesaid prior art current mode logic (CML) based configuration and accordingly is generally not high power-consuming or limited by the static power consumption. The electronic system for implementing DFE may save on power and area despite having been scaled to higher speeds in contrast with the conventional half-rate DFE.

While specific language has been used to describe the disclosure, any limitations arising on account of the same are not intended. As would be apparent to a person in the art, various working modifications may be made to the above-described methods and systems to implement embodiments of the inventive concepts as taught herein.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein.

Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. An electronic-system for implementing decision-feedback equalization (DFE), the system comprising:
   a first stage comprising a first-amplifier, the first amplifier comprising a in-built adder circuit, the first amplifier being configured to:
       charge one or more output nodes of the first amplifier to a first voltage using a summed signal based on input data and a feedback signal in response to a first-clock variation, wherein the feedback signal is a partially-regenerated analog output from a regenerating amplifier;
   a second stage comprising a second amplifier configured as the regenerating amplifier and connected to the one or more output nodes of the first amplifier, the second amplifier configured to:
       amplify charged output nodes of the second stage to a second voltage in response to a second-clock variation and apply a regenerative gain to the amplified second-voltage during the second-clock variation to generate the partially-regenerated analog output; and
   a third stage comprising a slave latch that is configured to resolve the partially-regenerated analog output at the output nodes of the second stage into non-return to zero (NRZ) digital values at an output of the third stage.

2. The electronic-system as claimed in claim 1, further comprising a feedback-path from the output nodes of the second amplifier to the in-built adder circuit that is configured to communicate the partially-regenerated analog output from the output nodes of the second stage to the in-built adder circuit for addition into the received input signal.

3. The electronic system as claimed in claim 2, wherein the feedback path comprises a differential amplifier configured to amplify the partially regenerated analog output.

4. The electronic-system as claimed in claim 1, wherein the first stage and the second stage are driven by complementary clocks, respectively, or a same clock.

5. The electronic-system as claimed in claim 1, wherein the first amplifier and the second-amplifier each comprises one or more of a differential-amplifier or a single ended amplifier configured to operate based on an amplification of the differential inputs.

6. The electronic-system as claimed in claim 1, wherein the first amplifier and second amplifier are configured to operate based on clock signals during the same time-period corresponding to each of the clock-signals.

7. The electronic-system as claimed in claim 1, wherein the summed signal comprises:
a summed differential current obtained by summing drain currents of a differential-transistor configuration corresponding to the input signal and the feedback signal obtained through a differential amplifier in the feedback path; and/or
a summed differential-voltage obtained by summing differential voltages of the differential-transistor configuration.

8. The electronic-system as claimed in claim 7, wherein the first voltage is generated based on a charge or discharge of a capacitor at the one or more output nodes of the first amplifier in response to the summed signal.

9. The electronic-system as claimed in claim 7, wherein the first voltage is a positive differential voltage obtained based on a sign of differential current defining the summed-signal.

10. The electronic-system as claimed in claim 1, wherein the first amplifier is further configured to generate an equalized signal based on an addition of the input data to the feedback signal.

11. The electronic-system as claimed in claim 1, wherein the first amplifier comprises a sense amplifier.

12. The electronic-system as claimed in claim 1, wherein the input data and the feedback signal exhibit same or opposite polarity and relate to different-branches with respect to a half-rate DFE implementation or quarter rate DFE implementation, each branch being defined by the first amplifier and the second amplifier.

13. The electronic-system as claimed in claim 1, wherein the slave latch comprises a flip-flop that is configured in a slave-configuration and is connected at the output nodes of the second stage.

14. The electronic-system as claimed in claim 1, wherein the first amplifier, the second amplifier, and a feedback-path from the output nodes of the second amplifier to the in-built adder circuit comprise a master component;
wherein the slave latch comprises a slave component; and
wherein a settling of summation time in the in-built adder circuit coincides with a set-up time of the slave latch.

15. A flip-flop for implementing decision-feedback equalization (DFE), the flip-flop comprising:
a master latch comprising:
a first amplifier comprising an in-built adder circuit, the first amplifier configured to charge one or more output nodes of the first amplifier to a first voltage using a summed signal based on input data and a feedback signal in response to a first-clock variation, wherein the feedback signal is a partially-regenerated analog output from a regenerating amplifier; and
a second amplifier that is configured to generate the partially-regenerated analog output; and
a slave latch configured to resolve the partially-regenerated analog output into non-return to zero (NRZ) digital values at an output of the third stage.

16. The flip-flop as claimed in claim 15, further comprising a feedback path comprising a differential amplifier between the second amplifier and the in-built adder circuit, the differential amplifier being configured to amplify the partially-regenerated analog output.

17. The flip-flop as claimed in claim 15, wherein the first amplifier is further configured to generate an equalized signal based on an addition of the input data to the feedback signal.

18. The flip-flop as claimed in claim 15, wherein the second amplifier is further configured to amplify charged output nodes of the second stage to a second voltage in response to a second-clock variation.

19. The flip-flop as claimed in claim 18, wherein the second amplifier is configured to generate the partially-regenerated analog output by applying a regenerative gain to the amplified second voltage.

20. The flip-flop as claimed in claim 15, wherein a settling of summation time in the in-built adder circuit coincides with a set-up time of the slave latch.

* * * * *